(12) United States Patent
Chou et al.

(10) Patent No.: US 7,064,068 B2
(45) Date of Patent: Jun. 20, 2006

(54) METHOD TO IMPROVE PLANARITY OF ELECTROPLATED COPPER

(75) Inventors: Shih-Wei Chou, Taipei (TW); Ming-Hsing Tsai, Chu-Pei (TW); Ming-Wei Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 10/763,306

(22) Filed: Jan. 23, 2004

(65) Prior Publication Data
US 2005/0164495 A1    Jul. 28, 2005

(51) Int. Cl.
*H01L 21/44* (2006.01)

(52) U.S. Cl. ................ 438/687; 438/638; 438/641

(58) Field of Classification Search ............. 438/687
See application file for complete search history.

(56) References Cited

U.S. PATENT DOCUMENTS

| | | | |
|---|---|---|---|
| 5,814,557 A | 9/1998 | Venkatraman et al. | 438/622 |
| 6,136,707 A | 10/2000 | Cohen | 438/687 |
| 6,140,241 A | 10/2000 | Shue et al. | 438/692 |
| 6,207,222 B1 | 3/2001 | Chen et al. | 427/97 |
| 6,346,479 B1 | 2/2002 | Woo et al. | 438/687 |
| 2004/0012090 A1* | 1/2004 | Basol et al. | 257/755 |

* cited by examiner

*Primary Examiner*—Carl Whitehead, Jr.
*Assistant Examiner*—Colleen E. Rodgers
(74) *Attorney, Agent, or Firm*—Haynes and Boone, LLP

(57) ABSTRACT

Narrow trenches in a substrate tend to fill more rapidly than wide trenches This results in a non-planar surface once all trenches have been filled. The present invention solves this problem by performing the electro-deposition in two steps. The plating bath used during the first step, is optimized for filling narrow trenches while the plating bath used during the second step, is optimized for filling wide trenches. The net result is a final layer having a planar surface, with all trenches being properly filled.

24 Claims, 2 Drawing Sheets

METHOD TO IMPROVE PLANARITY OF ELECTROPLATED COPPER

FIELD OF THE INVENTION

The invention relates to the general field of integrated circuits with particular reference to filling trenches with metal.

BACKGROUND OF THE INVENTION

With the introduction of the damascene process, the formation of wires by filling trenches has become routine. Additionally, particularly for the case of copper-filled trenches, the method of choice for depositing the metal has been electroplating. However, as trenches have become narrower and narrower, it has become necessary to employ a range of additives that need to be included in the plating solution to give the best filling results. The technology involved is further complicated by the fact that the effects of these multiple additives are often interactive.

We can identify three broad additive types:

Accelerators serve to increase the deposition rate during electroplating. They are usually small organic molecules containing a polar sulfur, oxygen, or nitrogen functional group. In addition to increasing the deposition-rate, they promote denser nucleation which leads to the growth of films having a finer grain structure. Accelerators are usually present in the plating bath at a low concentration level (1–25 ppm).

Suppressors are additives that reduce the plating rate and are usually present in the plating bath at higher concentrations (200–2,000 ppm), so that their concentration at the interface is not strongly dependent on their rate of mass transfer or diffusion to the wafer surface. They are generally polymeric surfactants with high molecular weight such as polyethylene glycol (PEG). The suppressor molecules slow down the deposition rate by adsorbing on the wafer surface where they form a diffusion barrier.

Levelers are additives whose purpose is to reduce surface roughness. They are similar to suppressors in that they reduce deposition rate. However, they are present in very small concentrations (<25 ppm) so their blocking effects at the surface are highly localized. The net effect is that they selectively reduce deposition on the high spots thereby giving the low spots a chance to 'catch up'.

It has been known for some time that narrow trenches (typically having widths less than about 1 microns) tend to fill more rapidly than wide trenches (typically having widths greater than about 2 microns). This results in problems of the type schematically illustrated in FIG. 1. Seen there, in cross-section, is a portion of a substrate (typically a silicon wafer) 11 in whose upper surface several narrow trenches 12 and one wide trench 13 have been formed. After electro-deposition of metal layer 14 the latter is found to have the profile shown, i.e. it locally thicker over the narrow trenches and locally thinner over the wide trench.

The general approach that the prior art has taken to dealing with this problem has been to try to balance the concentrations of the various additives so as to find a single formulation that works well for both narrow and wide trenches simultaneously. As will be shown, the present invention has abandoned this approach in favor of a two-step plating method.

A routine search of the prior art was performed with the following references of interest being found:

In U.S. Pat. No. 6,346,479 B1, Woo et al. show an electroplating process of first filling holes using an electroplating process that has been optimized for conformal coating followed by a second electroplating step that has been optimized for non-conformal coating. Trench width is not explicitly taught as a criterion for determining which solution to use where.

Chen et al., in U.S. Pat. No. 6,207,222 B1, show multi-step plating to fill a Cu dual damascene opening while U.S. Pat. No. 6,140,241 (Shue et al.), U.S. Pat. No. 6,136,707 (Cohen), and U.S. Pat. No. 5,814,557 (Venkatranman) all show related plating processes.

SUMMARY OF THE INVENTION

It has been an object of at least one embodiment of the present invention to provide a process for filling trenches in a substrate by depositing a metal layer through electroplating.

Another object of at least one embodiment of the present invention has been that said trenches have at least two different widths.

Still another object of at least one embodiment of the present invention has been that, at the conclusion of said process, said metal layer has a planar surface.

These objects have been achieved by performing the electro-deposition in two steps. The plating bath used during the first step, is optimized for filling narrow trenches while the plating bath used during the second step, is optimized for filling wide trenches. The net result is a final layer having a planar surface, with all trenches being properly filled.

DESCRIPTION OF THE PREFERRED EMBODIMENTS

Some examples of accelerators are 3-sulfopropyldisulfide, 41 sulfonated acetylthiourea, 3-mercapto-1-propanesulfonate (MPSA), and dibenzyl-dithio-carbamate.

Figure 2:
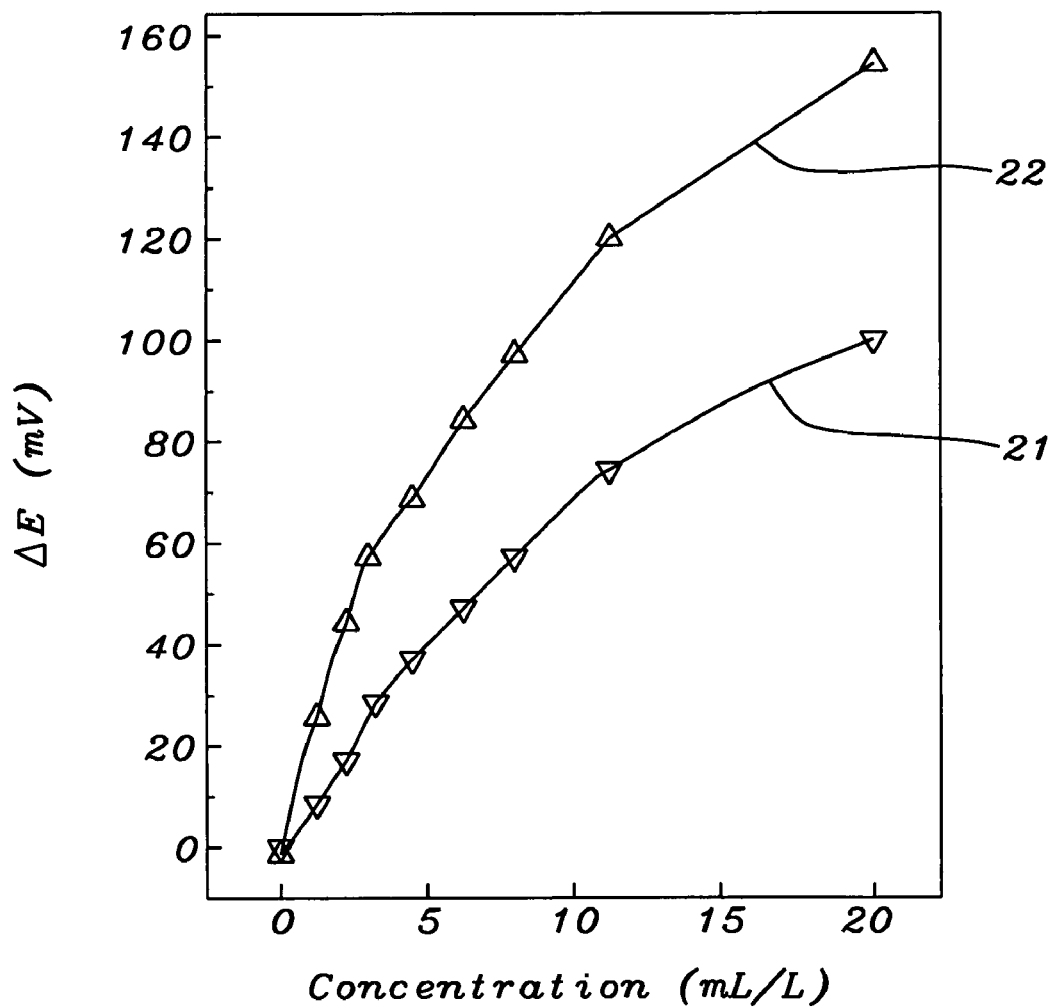
FIG. 2 is a plot of deposition rate vs. concentration for two different accelerator additives.

The precise concentration of accelerator additive that is needed to produce a given deposition rate can vary from one additive to another. We illustrate this in FIG. 2 which compares the effects of two different chemicals when added to a plating bath as an accelerator. Curves 21 and 22 are plots of 'potential difference needed to initiate plating' (which equates with film growth rate) vs. additive concentration in parts per thousand. Thus, although both curves are similar in form, the chemical associated with curve 21 is less effective than the one associated with curve 22. Examples of the former include 3-sulfopropyldisulfide, while examples of the latter include 3-mercapto-1-propanesulfonate (MPSA).

Figure 1:
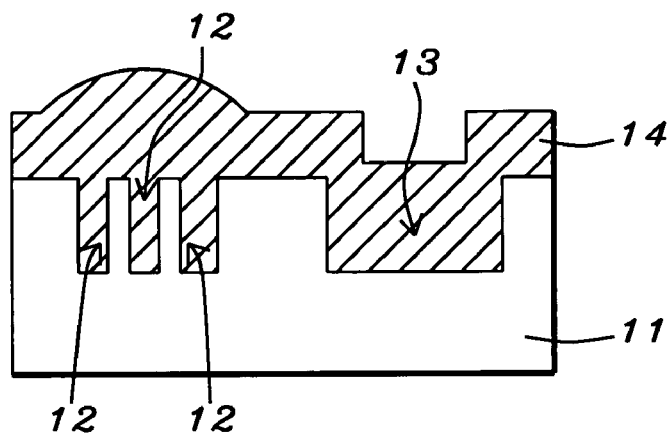
FIG. 1 illustrates a problem associated with filling, through electroplating, a surface that contains trenches whose widths vary over a wide range.

The process of the present invention begins with the provision of silicon wafer 11 (as seen for example in FIG. 1) in whose upper surface there are multiple trenches having a range of widths. These trenches will have been lined with a barrier layer to contain the copper. This barrier layer may be of a material such as TiN that is sufficiently conductive to serve as a cathode for the copper deposition and/or an additional seed layer of copper, or copper doped with titanium, magnesium, zirconium, tin, or zinc, may first be laid down as a seed layer.

Also provided at the start of the process is an aqueous solution of at least one copper salt. A typical formulation for this aqueous solution would be 10–50 g/l cap, SGHS, 5–300 g/l $H_2SO_4$, and 20–100 ppm HCl. Two plating solutions are then formed from this. Each is the original aqueous copper solution to which an accelerator chemical has been added. A different chemical may be used for each plating solution and, in general, the additive concentration in the second plating solution will be greater than in the first one.

Examples of accelerator additives suitable for use in the first plating solution include (but are not limited to) 3-sulfopropyldisulfide and 3-mercapto-1-propanesulfonate (MPSA) at a concentration that is between about 10 and 100 ppm. Additionally, the first plating solution will include a short chain polymer (less than about 200 units per chain) having low molecular weight (less than about 10,000).

For the second plating solution, our preferred accelerator additive has been 3-sulfopropyldisulfide at a concentration is between about 10 and 50 ppm, but other accelerator additives such as sulfonated acetylthiourea, 3-mercapto-1-propanesulfonate, dibenzyl-dithio-carbamate, 2-mercaptoethanesulfonate, or n, n dimethyldithiocarbamic acid-(3-sulfopropyl)ester could have also been used. Additionally, the second plating solution will include a long chain polymer (more than about 1,000 units per chain) having high molecular weight (more than about 50,000).

Figure 3:
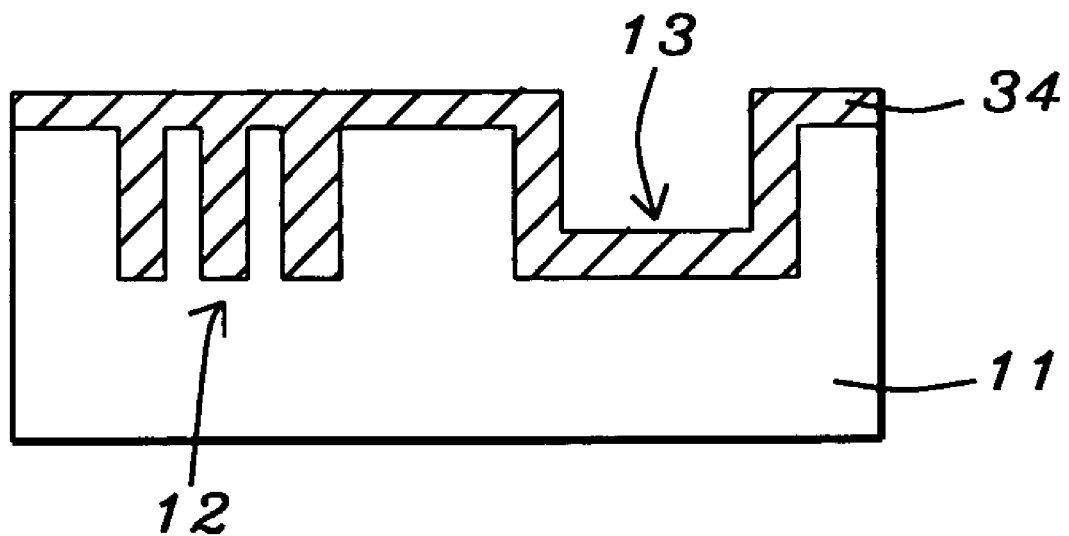
FIG. 3 is a schematic cross-section through a substrate part way through the process of the present invention.

Then, in a bath that contains the first plating solution, electroplating onto the wafer surface is initiated and allowed to proceed until sufficient copper has been deposited to overfill all trenches whose width is less than about 0.2 microns while under-filling all trenches whose width exceeds this. At this point, the thickness of deposited copper would typically be between about 0.1 and 0.2 microns. The result is illustrated in FIG. 3 where it can be seen that the narrow trenches 12 have been uniformly over-filled with copper 34 while wide trench 13 is only partially filled. It is clear that if electroplating were allowed to continue under these conditions, the result would be as was seen in FIG. 1.

Figure 4:
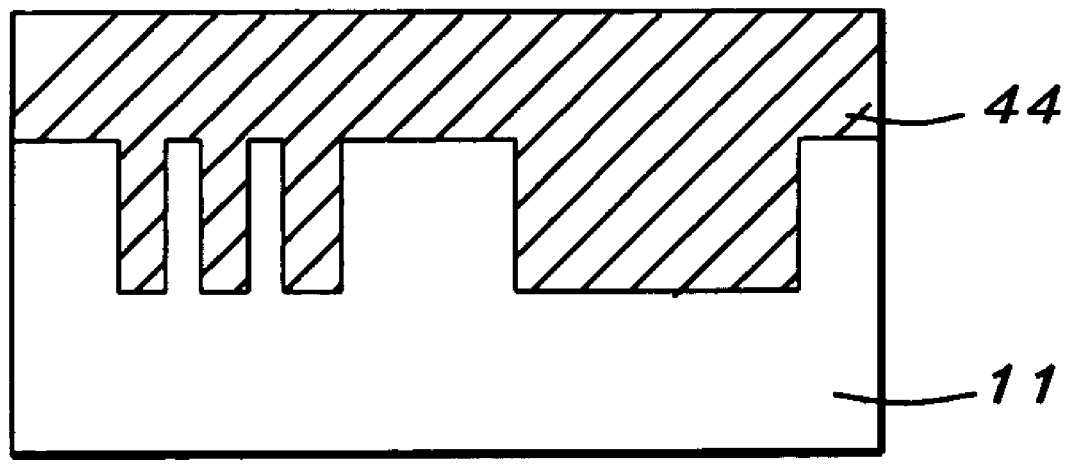
FIG. 4 is a schematic cross-section through a substrate at the conclusion of the process of the present invention.

Instead, in a departure from the prior art, the wafer is now transferred to a second bath that contains the second of the two plating solutions mentioned above, i.e. to a plating solution in which there is dissolved a more powerful accelerator additive and/or a higher concentration of accelerator. Electroplating is now resumed. The plating solution in the second bath is now such as to be optimized for filling wide trenches. The result is that electroplated material in the trench builds up faster than outside it so that electroplated layer 44 (FIG. 4) that is obtained once the wide trenches have been overfilled, ends up with a surface that is essentially planar, for an additional copper thickness that is between about 0.3 and 0.5 microns.

Two other embodiments of the present invention apply the above process with some modifications. Both additional embodiments still make use of two different solutions but only a single plating chamber, or container, is required. Such an approach is useful, for example, in a small-scale operation such as a pilot line.

In the first of these additional embodiments, when the first plating step has been completed (narrow trenches overfilled), the wafer is left in place (so that electrical connections to it need not be disconnected), the first plating solution is emptied out of the container, is replaced by the second plating solution, and plating is resumed.

In the second additional embodiment, when the first plating step has been completed (narrow trenches overfilled), the wafer is left in place (so that electrical connections to it need not be disconnected), while the first plating solution is gradually and continuously replaced by the second plating solution. If the only difference between the two plating solutions is in the concentration of the accelerator additive, the step can be further simplified by merely adding additional accelerant to the bath. In this embodiment, there is no need to terminate electro-deposition while the solutions are being changed it being, in fact, advantageous to allow deposition to continue since, as the plating solution composition changes, it becomes steadily more suited to wider and wider trenches.

TABLE I below provides a summary of the compositions of the two baths:

TABLE I

| Chemical | Components | Concentration | |
|---|---|---|---|
| | | Bath 1 | Bath 2 |
| VMS | Cu/H2S04/Cl | 3060 g/L Cu, 5–30 g/L H2S04 and 20–100 mg/L (ppm) Cl | 15–60 g/L Cu, 5–300 g/L H2S04 and 20–100 mg/L (ppm) CI |
| Accelerator | Bis (3-sulfopropyl) disulfide, 3-mercapto-propylsulfonic acid, 3-mercapto-propylsulfonic acid-(3-sulfopropul)ester | 10–30 ppm | 5–10 ppm |
| Suppressor | Polyalkylene glycols, Polyoxyalkyene glycols, copolymer of polyoxyalkyenes | 50–200 ppm | 200–1000 ppm |
| Leveler | Alkylated polyalkyleneimine, 2-mercatothiazoline | 0 ppm | 1–20 ppm |

What is claimed is:

1. A process to form damascene structures, comprising:

providing a substrate having an upper surface in which are a plurality of trenches that have at least two different widths, said trenches having a conductive surface;

providing a first electrolytic solution comprising a comparatively short chain polymer to trenches having a narrower width of the two different widths, and a second electrolytic solution comprising a comparatively long chain polymer to trenches having a wider width of the two different widths;

electroplating from said first solution a sufficient thickness of a metal to overfill all narrower trenches while under-filling all wider trenches; and then electroplating from said second solution a sufficient thickness of said metal to overfill all trenches.

2. The process described in claim 1 wherein said first electrolytic solution has a low molecular weight, when compared to the second electrolytic solution.

3. The process described in claim 1 wherein said narrower trenches have a width less than about 0.2 microns, and said wider trenches have a width greater than about 1 micron.

4. A process for filling trenches with copper, comprising:
providing a silicon wafer having an upper surface in which are a plurality of trenches that have at least two different widths, all trenches being lined with a conductive barrier layer;
providing an aqueous solution that comprises at least one copper salt; forming a first plating solution that contains a first concentration, in said aqueous solution, of a first accelerator additive;
forming a second plating solution that contains a second concentration, in said aqueous solution, of a second accelerator additive, said second concentration being greater than said first concentration;
in a first bath that contains said first plating solution, electroplating onto said upper surface a first thickness of copper that is sufficient to overfill all trenches whose width is less than an amount while under-filling all trenches whose width is greater than said amount; and
then transferring said wafer to a second bath that contains said second plating solution and electroplating on the wafer a second thickness of copper that is sufficient to overfill all trenches.

5. The process described in claim 4 wherein said aqueous solution further comprises 10–50 g/L copper salts, 5–300 g/L $H_2SO_4$, and 20–100 ppm HCl.

6. The process described in claim 4 wherein said amount is between about 0.2 and 1 microns.

7. The process described in claim 4 wherein said first accelerator additive is at a concentration that is between about 10–100 ppm.

8. The process described in claim 4 wherein said second accelerator additive is 3-sulfopropyl disulfide.

9. The process described in claim 8 wherein said second accelerator additive concentration is between about 10–100 ppm.

10. The process described in claim 4 wherein said second accelerator additive is sulfonated acetylthiourea, 3-mercapto-1-propanesulfonate, dibenzyl-dithio-carbamate, 2-mercaptoethanesulfonate, or n.n-dimethyl-dithiocarbamic acid-(3-sulfopropyl)ester.

11. The process described in claim 4 wherein said first thickness of electroplated copper is between about 0.1 and 0.2 microns.

12. The process described in claim 4 wherein said second thickness of electroplated copper is between about 0.2 and 0.5 microns.

13. The process described in claim 4 wherein said conductive barrier layer is TiN, Ta/Ti/TaN, or WN.

14. A Process for filling trenches with copper, comprising:
providing a silicon wafer having an upper surface in which are a plurality of trenches that have at least two different widths, all trenches being lined with a seed layer;
providing an aqueous solution that comprises at least one copper salt; forming a first plating solution that contains a first concentration, in said aqueous solution, of a first accelerator additive;
forming a second plating solution that contains a second concentration, in said aqueous solution, of a second accelerator additive, said second concentration being greater than said first concentration;
in a first bath that contains said first plating solution, electroplating onto said seed layer a first thickness of copper that is sufficient to overfill all trenches whose width is less than an amount while under-filling all trenches whose width is greater than said amount; and
then transferring said wafer to a second bath that contains said second plating solution and electroplating on the wafer a second thickness of copper that is sufficient to overfill all trenches.

15. The process described in claim 14 wherein said aqueous solution further comprises 10–50 g/L copper salts, 5–300 g/L $H_2SO_4$, and 20–100 ppm HCl.

16. The process described in claim 14 wherein said amount is between about 0.2 and 1 micron.

17. The process described in claim 14 wherein said first accelerator additive is 3-sulfopropyldisulfide, 3-mercaptopropanesulfonate at a concentration that is between about 10 and 100 ppm.

18. The process described in claim 14 wherein said second accelerator additive is 3-sulfopropyldisulfide.

19. The process described in claim 18 wherein said second accelerator additive concentration is between about 10–100 ppm.

20. The process described in claim 14 wherein said second accelerator additive is sulfonated acetylthiourea, 3-mercapto-1-propanesulfonate, dibenzyl-dithio-carbamate, 2-mercaptoethanesulfonate, or n,n-dimethyl-dithiocarbamic acid-(3-sulfopropyl)ester.

21. The process described in claim 14 wherein said first thickness of electroplated copper is between about 0.1 and 0.2 microns.

22. The process described in claim 14 wherein said second thickness of electroplated copper is between about 0.3 and 0.5 microns.

23. The process described in claim 14 wherein said seed layer is copper.

24. The process described in claim 14 wherein said seed layer is copper doped with titanium, magnesium, zirconium, tin, or zinc.

* * * * *